US007369030B2

(12) United States Patent
Darr

(10) Patent No.: US 7,369,030 B2
(45) Date of Patent: May 6, 2008

(54) FUSE STATE INDICATOR

(75) Inventor: Matthew R. Darr, Godfrey, IL (US)

(73) Assignee: Cooper Technologies Company, Houston, TX (US)

( * ) Notice: Subject to any disclaimer, the term of this patent is extended or adjusted under 35 U.S.C. 154(b) by 185 days.

(21) Appl. No.: 10/936,406

(22) Filed: Sep. 8, 2004

(65) Prior Publication Data

US 2006/0049911 A1 Mar. 9, 2006

(51) Int. Cl.
*H01H 85/30* (2006.01)
*G01R 31/07* (2006.01)
*G08B 23/00* (2006.01)
*G08B 21/18* (2006.01)

(52) U.S. Cl. ...................... 337/243; 337/244; 337/206; 337/265; 324/550; 340/638

(58) Field of Classification Search ................ 337/243, 337/265, 206, 244; 439/488, 489; 324/550; 340/638
See application file for complete search history.

(56) References Cited

U.S. PATENT DOCUMENTS

| | | | | |
|---|---|---|---|---|
| 737,280 | A | 8/1903 | Sachs | |
| 737,281 | A | 8/1903 | Sachs | |
| 737,368 | A | 8/1903 | Downes | |
| 737,369 | A | 8/1903 | Downes | |
| 792,530 | A | 6/1905 | Marshall | |
| 809,978 | A * | 1/1906 | Ogle | 337/243 |
| 866,716 | A | 9/1907 | Cole | |
| 1,014,741 | A | 10/1912 | Barringer et al. | |
| 1,040,150 | A | 10/1912 | Cole | |
| 1,087,120 | A | 2/1914 | Hooker | |
| 2,175,250 | A | 10/1939 | Burrows et al. | |
| 2,737,552 | A | 3/1956 | Hitchcock | |
| 3,281,557 | A * | 10/1966 | Fister | 337/244 |
| 3,663,915 | A * | 5/1972 | Kozacka | 337/244 |
| 3,678,430 | A * | 7/1972 | Gaia | 337/159 |
| 3,721,936 | A * | 3/1973 | Belcher | 337/241 |
| 3,764,949 | A * | 10/1973 | Swain et al. | 337/244 |
| 3,958,206 | A * | 5/1976 | Klint | 337/406 |
| 4,023,133 | A * | 5/1977 | Knapp, Jr. | 337/206 |
| 4,204,182 | A * | 5/1980 | Knapp, Jr. | 337/244 |
| 4,308,516 | A | 12/1981 | Shimada et al. | |
| 4,323,874 | A * | 4/1982 | Link | 337/244 |
| 4,387,358 | A * | 6/1983 | Knapp, Jr. | 337/244 |
| 4,760,367 | A | 7/1988 | Williams | |
| 5,122,774 | A | 6/1992 | Morrill, Jr. et al. | |
| 5,418,516 | A | 5/1995 | Oh | |
| 5,781,095 | A * | 7/1998 | Dietsch et al. | 337/243 |
| 5,821,849 | A * | 10/1998 | Dietsch et al. | 337/241 |
| 5,886,613 | A * | 3/1999 | Magoon et al. | 337/244 |
| 5,994,993 | A | 11/1999 | Castonguay, Jr. et al. | |
| 6,373,370 | B1 | 4/2002 | Darr et al. | |
| 6,456,189 | B1 * | 9/2002 | Mosesian et al. | 337/243 |
| 6,566,996 | B1 * | 5/2003 | Douglass et al. | 337/243 |
| 6,831,546 | B2 * | 12/2004 | Kaltenborn et al. | 337/244 |
| 2005/0231319 | A1 * | 10/2005 | Darr et al. | 337/206 |

* cited by examiner

Primary Examiner—Anatoly Vortman
(74) *Attorney, Agent, or Firm*—King & Spalding LLP

(57) ABSTRACT

A fuse state indicator includes an extension member, a secondary fuse link coupled to the extension member, and a contact pin configured to engage a first terminal element of a fuse. An end of the secondary fuse link is wrapped around the pin and establishes an electrical connection thereto.

22 Claims, 2 Drawing Sheets

FUSE STATE INDICATOR

CROSS REFERENCE TO RELATED APPLICATIONS

The subject matter of this application is related to commonly owned U.S. application Ser. No. 09/537,518 filed Mar. 29, 2003, now issued U.S. Pat. No. 6,556,996, the disclosure of which is hereby incorporated by reference in its entirety, and is also related to the subject matter of commonly owned U.S. application Ser. No. 10/823,905, filed Apr. 14, 2004, the disclosure of which is hereby incorporated by reference in its entirety.

BACKGROUND OF THE INVENTION

This invention relates generally to fuses and, more particularly, to fuses with a fuse state indicator.

Fuses are widely used as overcurrent protection devices to prevent costly damage to electrical circuits. Fuse end caps typically form an electrical connection between an electrical power source and an electrical component or a combination of components arranged in an electrical circuit. A fusible link is connected between the fuse end caps, so that when electrical current flowing through the fuse exceeds a predetermined limit, the fusible link melts and opens the circuit through the fuse to prevent electrical component damage.

Various types of fuse state indicators have been developed in an attempt to more efficiently locate opened fuses for replacement. For example, U.S. Pat. No. 6,566,996 to Douglass et al., is directed toward a combustible fuse state indicator which is notable both for its low cost construction and its reliability in comparison to other types of indicators. The combustible fuse state indicator of the '996 patent includes a combustible substance located adjacent a transparent lens extending through a side of a rectangularly shaped fuse module. A secondary fuse link extends adjacent the combustible substance and heat associated with opening of the secondary fuse link ignites the combustible substance to reveal a backing layer of a contrasting color. The fuse state indicator of the '996 patent, however, is designed for use with a rectangular fuse module, and implementing such an indicator in other types of fuses presents a number of issues.

For example, in a cylindrical or cartridge fuse, the fuse indicator assembly must be accommodated in a comparatively smaller space than in a rectangular fuse module. Also, the secondary fuse link for the indicator must be electrically connected interior to the fuse body to conductive end caps or terminal elements coupled to the fuse body. Reliably establishing the electrical connection and properly orienting the secondary fuse link with respect to the combustible substance is difficult. Also, due to the curvature of the fuse body, the backing layer beneath the combustible substance can be difficult to see when the combustible substance is consumed.

Still further, in fuses having end caps crimped over a body of the fuse, conductive clips and twisted wire terminations may be used to electrically connect the secondary fuse link of the indicator to the end caps while the end caps mechanically hold the clips and/or terminations in place. In other types of fuses not having end caps, such as knife blade fuses having end bell assemblies, establishing a secure mechanical and electrical connection between the secondary fuse link of the indicator and the end bell assemblies with known clips and terminations is problematic. Relative movement between the end bell assemblies and the indicator as the end bells are installed can damage or break the electrical connections to the indicator.

In some known fuses having end bells and a fuse state indicator, the indicator is soldered to the end bells and an adhesive backing sheet is employed to locate the indicator in a predetermined position with respect to the body. While soldered connections and adhesive backing materials may have some success in establishing electrical connections to the end bells, they do so at an increased cost.

It would therefore be desirable to provide a lower cost fuse state indicator that may be reliably attached to fuses without end caps, such as cylindrical fuses having end bell assemblies.

BRIEF DESCRIPTION OF THE INVENTION

According to an exemplary embodiment, a fuse state indicator is provided. The fuse state indicator comprises an extension member, a secondary fuse link coupled to the extension member, and a contact pin configured to engage a first terminal element of a fuse. An end of the secondary fuse link is wrapped around the pin and establishes an electrical connection thereto.

According to another embodiment, an electric fuse is provided. The fuse comprises a nonconductive fuse body, first and second terminal elements coupled to the fuse body, and a primary fuse element electrically connected between the first and second terminal elements. The primary fuse link extends within and is enclosed by the fuse body, and a fuse state indicator assembly comprises a secondary fuse link electrically connected between the first and second terminal elements in parallel with the primary fuse link. A contact pin mechanically and electrically connects the secondary fuse link to one of the terminal elements.

According to still another embodiment, an electric fuse is provided. The fuse comprises a tubular fuse body having a first end and a second end and a longitudinal slot formed therein for fuse state identification, first and second end bell assemblies coupled to the body, and a primary fuse element electrically connected between the first and second end bell assemblies. A fuse state indicator assembly comprises an extension member, a secondary fuse link coupled to the extension member, and at least one contact pin coupled to the secondary fuse link and establishing an electrical connection to one of the first and second end bell assemblies.

DETAILED DESCRIPTION OF THE INVENTION

Figure 1:
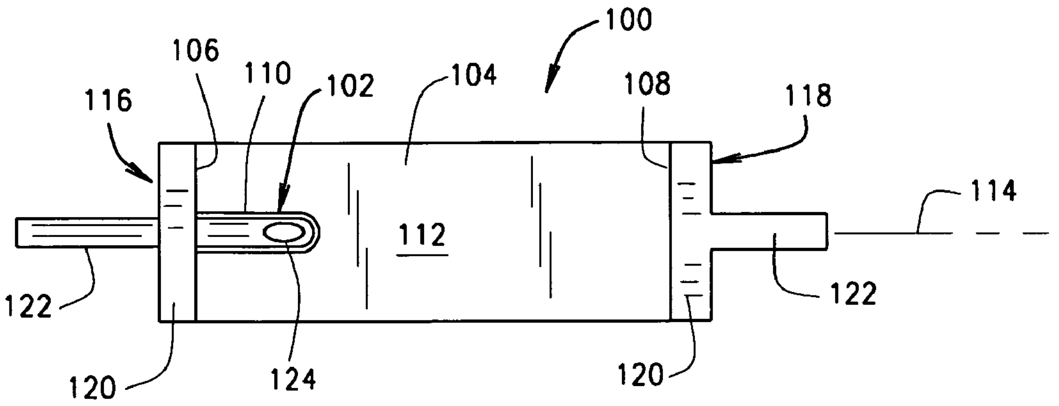
FIG. 1 is a top plan view of an exemplary fuse including a state indicator.

FIG. 1 is a top plan view of an exemplary fuse 100 including a fuse state indicator assembly 102 which, for the reasons set forth below, may be reliably mechanically and electrically connected to the fuse in a low cost and straightforward manner. In an exemplary embodiment, the fuse 100 includes a cylindrical fuse tube or body 104 fabricated from an insulative (i.e., nonconductive) material and having a first end 106, a second end 108 and a bore (not shown in FIG. 1) extending therebetween which houses a primary fuse element assembly (not shown in FIG. 1). An elongated slot 110 is formed in the body 104, and a portion of the indicator assembly 102 is located in the slot 110 on an outer surface 112 of the body 104. In one embodiment, the slot 110 extends from the first end 106 of the body 104 toward the second end 108 for a predetermined distance, and the slot 110 extends in a direction generally parallel to a longitudinal axis 114 of the fuse 100.

Conductive terminal elements 116 and 118 are attached to the fuse body 104 on each end 106 and 108 of the body 104. In an exemplary embodiment, the terminal elements 116 and 118 are each an end bell assembly including a base 120 which is received in the ends 106, 108 of the body 104, and blades 122, sometimes referred to as knife blades, extending outwardly from the base 120. The terminal elements 116 and 118 may be connected to line side and load side electrical circuitry (not shown), thereby forming a current path through the primary fuse element assembly. In accordance with known fuses, the primary fuse element assembly may include one or more fusible links or a fuse elements extending through the fuse body 104 between the terminal elements 116 and 118.

A portion of the fuse state indicator assembly 102 is situated in the slot 110 in the body 104 proximate the first end 106 and the terminal element 116. The portion of the fuse state indicator 102 is visible through the slot 110 in the body 104 to indicate an operating condition or state of the fuse 100 via an indicator window 124. The fuse state indicator assembly 102 is electrically connected to the terminal elements 116 and 118 in the manner explained below, and indicates the operating state or condition of the primary fuse element assembly. More specifically, the window 124 indicates, in the manner explained below, whether the primary fuse element assembly is in an unopened or operative state wherein current is conducted through the primary fuse element assembly, or whether the primary fuse element assembly is an opened or inoperative state wherein the circuit through the fuse element is broken. Thus, by visual observation of the window 124, inoperative or opened fuses may be rather quickly and easily identified for replacement.

While the invention is illustrated with respect to a particular fuse 100, it is believed that the benefits of the invention accrue to other types and configurations of fuses, and the fuse 100 is but one example of a fuse in which the indicator assembly 102 may be utilized. For example, while in the exemplary embodiment the fuse body 104 is elongated and generally cylindrical, it is appreciated that the benefits of the instant invention may apply to fuses having non-cylindrical bodies, such as rectangular fuse bodies and the like as those in the art will appreciate. Likewise, while the illustrated embodiment includes end bell terminal elements 116, and 118, the invention has equal applicability to other types of terminal elements known in the art for connecting line side and load side circuitry to the fuse. It is therefore understood that the invention is applicable to a wide variety of fuses intended for a wide variety of applications and having a wide variety of fuse ratings, and accordingly the embodiments of the invention shown and described herein are for illustrative purposes only. The invention is not intended to be limited to a particular fuse shape, type, class or rating.

Figure 2:
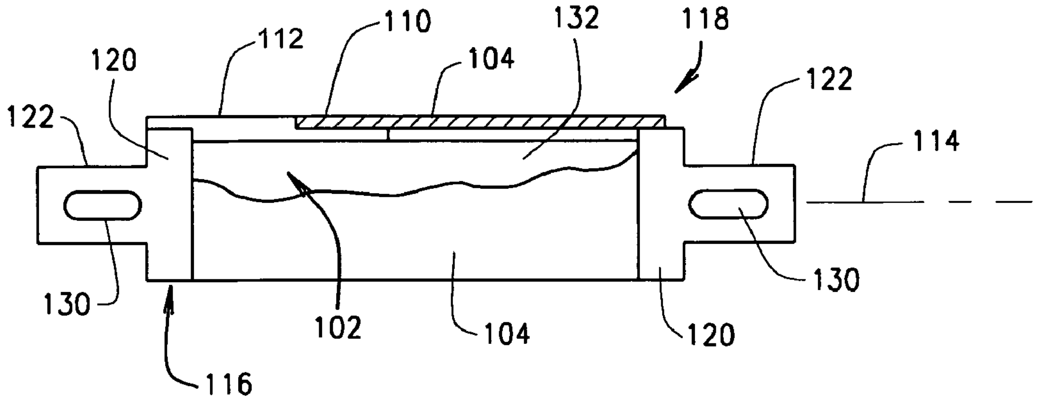
FIG. 2 is another plan view partly broken away of the fuse shown in FIG. 1.

FIG. 2 illustrates the exemplary fuse 100 rotated 90° about the longitudinal axis 114 from the position shown in FIG. 1. The terminal elements 116 and 118 extend from each respective end 106, 108 of the fuse body 104, and the blades 122 extend in a substantially rectangular configuration on each end of the body 104. In accordance with known blade fuses, apertures 130 are provided in the blades 122, although in alternative embodiments the apertures may be omitted as desired or as needed to obtain specified fuse performance and installation parameters.

As illustrated in FIG. 2, the fuse state indicator assembly 102 rests upon the base 120 of the first terminal element at a first end of the indicator assembly 102, extends within the slot 110 in the housing 104 and is substantially flush with the outer surface 112 of the fuse body 104, and extends interior to the fuse body 104 within an opening or bore formed in the body 104. As such, the fuse state indicator assembly 102 is partly exposed from the fuse body 104, and partly protected by the fuse body 104.

Figure 3:
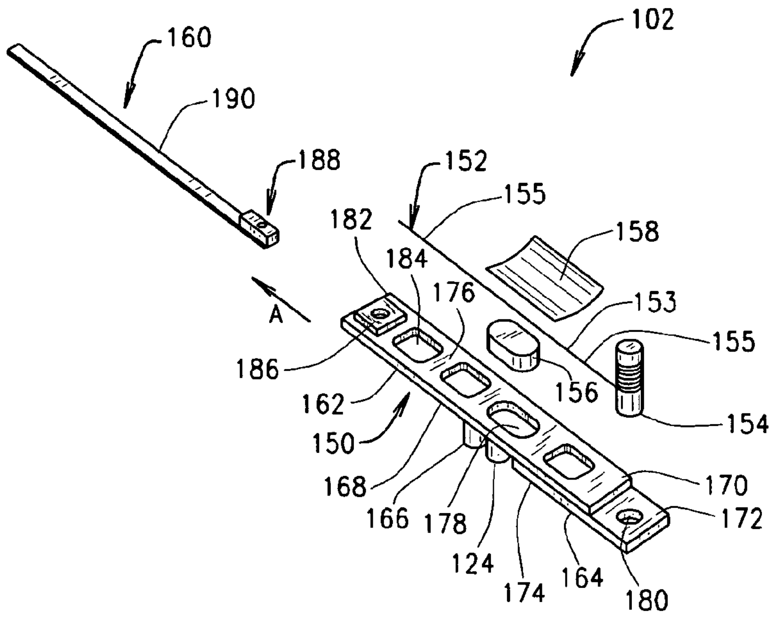
FIG. 3 is an exploded bottom perspective view of a fuse state indicator assembly for the fuse shown in FIGS. 1 and 2.

FIG. 3 is an exploded bottom perspective of an exemplary fuse state indicator assembly 102 for use with, for example, the fuse 100 (shown in FIGS. 1 and 2). In an illustrative embodiment, the fuse state indicator assembly 102 includes an insulative (i.e., nonconductive) extension member 150, a secondary fuse link 152, a contact pin 154, an indicator element 156, a backing layer 158 and a conductive clip 160.

The extension member 150 includes a clip portion 162 and an overlapping raised portion 164 extending from the clip portion 162. The raised portion 164 includes an end wall 166 which extends substantially perpendicularly to on outer surface 168 of the clip portion 162, and the clip portion 162 includes an end wall 170 which extends substantially perpendicularly to an inner surface 172 of the raised portion 164. As such, the outer surface 168 of the clip portion 162 is recessed relative to an outer surface 174 of the raised portion 164, and the inner surface 172 of the raised portion 164 is recessed relative to an inner surface 176 of the clip portion 162. In use, the raised portion 164 of the extension member 150 is received in the slot 110 (shown in FIGS. 1 and 2) of the fuse body 104 and the outer surface 168 of the clip portion 162 lies adjacent an interior surface of the fuse body (see FIG. 2), while the inner surface 172 of the raised portion 164 is positioned over the terminal element 116 (see FIG. 2), and the end walls 166, 172 function as stop surfaces to locate the extension member 150 with respect to the slot 110 and the terminal element 116, respectively. The raised portion 164 may include crush ribs on the side surfaces thereof which anchor the raised portion 164 to corresponding side surfaces of the slot 110 (FIG. 1) via an interference fit.

In an exemplary embodiment, the extension member 150 is generally bowed or curved in each of the clip and raised portions 162 and 164. The outer surface 168 of the clip portion 162 has a radius of curvature which is substantially equal to the radius of curvature of an inner surface of the fuse body 104, and the outer surface 174 of the raised portion 164 has a radius of curvature which is substantially equal to the radius of curvature of the outer surface 112 (FIG. 1) of the fuse body 104. The extension member 150 is elongated in a longitudinal direction parallel to the axis 114 (FIGS. 1 and 2) of the fuse 100, and the extension member 150 is curved in a lateral direction (i.e., a direction transverse to the axis 114) so that the extension member 150 generally conforms with and is complementary to the inner and outer surfaces of the fuse body 104 when the indicator assembly 102 is installed.

The extension member 150 further includes a recessed housing or cavity 178 extending from the inner surface 176 of the clip portion 162 toward the raised portion 164 and in a location adjacent the end wall 166 of the raised portion 164. The cavity 178 is sized and dimensioned to receive the indicator material 156 described below, and in one embodiment the cavity 178 includes the window 124 at a bottom thereof such that the window 124 is located adjacent the end of the slot 110 of the fuse body 104 as shown in FIG. 1. The window 124 is a transparent lens which may be fabricated from a transparent material known in the art, including, but not limited to, polycarbonate, polysulfone, polyethersulfone, and acrylic.

The extension member 150 also includes an aperture 180 formed in the inner surface 172 of the raised portion 164 which overhangs the clip portion 162, and the aperture 180 is accessible from the inner surface 172 to receive a portion of the contact pin 154. In one embodiment, the contact pin 154 is fabricated from a conductive material into a substantially cylindrical form, and the aperture 180 is cylindrical in shape and dimensioned to receive the contact pin 154 with an interference fit with the pin 154 extending outwardly from the surface 172 of the raised portion. It is recognized, however, that in alternative embodiments the pin 154 and the aperture 180 may be shaped otherwise without departing from the scope of the present invention.

A leading end 182 of the clip portion 162 includes a mounting aperture 184 and a mounting flange 186 which receive and attach, respectively, a hooked end 188 of the clip 160. The mounting flange 186, like the extension member 150, may be fabricated from a variety of materials known in the art, and in an exemplary embodiment, is fabricated from plastic.

In an exemplary embodiment, the indicator material 156 is a combustible substance in the form of a tuft of nitrocellulose cotton that is easily ignitable and substantially fills the recessed cavity 178 in the extension member 150. The indicator material 156 rests upon the backing layer 158 at a distance from the window 124. In an alternative embodiment, the indicator material 156 only partially fills the cylindrical housing 178, thereby creating an insulating air gap (not shown) between the window 124 and the indicator material 156 that both provides for combustion of the combustible substance and protects the window 124 from the associated heat when the secondary fuse link 152 ignites the indicator material 156. The indicator material 156 has a contrasting color relative to the backing layer 158, which may be any contrasting color relative to the indicator material 156 for ready indication of the fuse state, as described further below. In one embodiment, the indicator material 156 is white and the backing layer 158 is black.

In a further embodiment, a known energetic chemical compound may be used to assist ignition of the indicator material 156. One such energetic chemical compound is described in commonly owned U.S. Pat. No. 6,556,996. It is contemplated, however, that other compounds may be employed in other embodiments to assist or facilitate ignition and combustion of the indicator material 156.

In alternative embodiments, other readily combustible materials known in the art may be used in lieu of nitrocellulose cotton as the indicator material 156. For example, pure nitrocellulose, combustible substances such as cellulose paper, polymer film, polymer felt, and cellulose felt may be used within the scope of the present invention. In such embodiments, the indicator material 156 is located adjacent and/or within the recessed cavity 178 in various forms, including but not limited to circular disks that are, for example, 0.001 inches to 0.010 inches thick. The disks may be dimensioned to be larger in dimension than the cavity 178 and/or the window 124 so that the indicator material 156 extends beyond the recessed cavity 178.

The secondary fuse link 152 is coupled to the extension member 162 and to the hooked end 188 of the clip 160 at one end, and is coupled to the contact pin 154 at an opposite end. The secondary fuse link 152 has a much higher electrical resistance than the primary fuse element assembly (not shown in FIG. 3) of the fuse so that, during normal operation of the fuse, substantially all of the current passing through the fuse passes through the primary fuse element assembly. The secondary fuse link 152, however, is fabricated to melt at a designated current in accordance with a desired amperage rating of the fuse.

In an exemplary embodiment, the secondary fuse link 152 is fabricated from a fine fuse wire, such as, for example, a thin wire fabricated from copper, a copper alloy, or chrome, having a predetermined resistance which forms a high resistance portion 153 in the fuse link 152 proximate the cavity 178 in the extension member 150. A second wire, which is different from fuse wire, is wrapped or twisted about the fine fuse wire on the ends thereof to form lower resistance portions 155 on either side of the high resistance portion 153. A central portion of the fuse wire (i.e., the high resistance portion 153) in the vicinity of the combustible substance 156, however, does not include the second wire twisted thereabout. In an illustrative embodiment, the second wire has a comparatively lower resistance than the fuse wire and is for example, wound about the fuse wire for a predetermined number of twists to form the lower resistance portions 155 in the secondary fuse link 152. The twisted wire on the fuse wire of the secondary fuse link 152 effectively creates lower resistance termination portions 155 which may be mechanically and electrically connected in parallel with the primary fuse element assembly through the clip 160 and the contact pin 154 as described below, while providing a high resistance portion 153 proximate the combustible substance 156. The high resistance portion 153 ensures reliable ignition and consumption of the combustible substance 156 in an overcurrent condition to reveal the contrasting backing layer 158 and identify the operative state of the fuse as described above. With strategic employment of high and low resistance portions in the secondary fuse link 152, a wide range of electrical resistance combinations may be achieved in the secondary fuse link 152 to obtain a wide range of amperage ratings for the associated fuse (e.g., 6 A to 600 Au) in one embodiment.

In an alternative embodiment, a secondary fuse link 152 having a high resistance portion 153 and lower resistance portions 155 may be fabricated from a high resistance fine fuse wire coated, plated or overlaid with, for example, copper or another suitable material having a lower resistance. A portion of the copper plating may be stripped, cut, or otherwise removed from the plated wire to form the high resistance portion 153. The remaining plated portions of the wire flanking the high resistance portion 153 form the lower resistance portions 155 for termination to the terminal elements 116 and 118 (FIGS. 1 and 2).

In other embodiments, secondary fuse link 152 may be fabricated from a single fuse wire of a material known in the art, including but not limited to copper, and copper alloys including zinc, nickel, chromium, tin, iron, molybdenum, aluminum, berylium, and silicon.

The backing layer 158 is disposed adjacent and extends beyond the indicator material 156 so as to be concealed or hidden from view by the indicator material 156 when viewed through the top of the window 124 as shown in FIG. 1. The backing layer 158 is of a contrasting color relative to the indicator material 156, and is generally coextensive with the indicator material 156. Disposed between the indicator material 156 and the backing layer 158 is the secondary fuse link 152.

In an exemplary embodiment, the backing layer 158 is flexible and includes an adhesive or tacky layer on one side thereof. The flexible backing layer 158 is applied to the inner surface 176 of the extension member 150 adjacent the secondary fuse link 152 and the indicator material 156, thereby keeping the indicator material 156 in place within the recessed cavity 178 and maintaining the position of the secondary fuse link 152 with respect to the extension member 150. The backing layer 158 is fabricated from a relatively noncombustible material relative to the indicator material 156, and is contrasting in color relative to the indicator material 156. In an illustrative embodiment, the backing layer 158 is fabricated from, for example, black vinyl insulating tape having a sharp color contrast with the indicator material 156, and the vinyl insulating tape secures the secondary fuse link 152 to the extension member 150 proximate the indicator material 156. The flexibility of the vinyl insulating tape accommodates the curvilinear shape of the extension member 150 while reliably positioning the secondary fuse link 152 in proper position relative to the indicator material 156 to ensure reliable ignition thereof upon the occurrence of a specified overcurrent condition. In further, and/or alternative embodiments, other insulative (i.e., nonconductive) materials, whether flexible or rigid, may be employed by adhesive or other attachment methods in lieu of vinyl insulating tape to accommodate the curved shape of the extension member 150.

The clip 160 is fabricated from a conductive material, and in the illustrative embodiment, is fabricated from strips or ribbons of conductive material, such as copper or copper alloys, including but not limited to alloys including zinc, nickel, chromium, tin, iron, molybdenum, aluminum, beryllium, and silicon. The clip 160 is formed or folded to include the hooked end 188 extending from an elongated strip 190. The hooked end 188 is inserted through the mounting aperture 184 in the extension member 150 and moved in the direction of arrow A until the hooked end 188 is aligned with the mounting flange 182. A known fastener (e.g., a rivet or a screw) may then be inserted through the hooked end 188 and the mounting flange 182 to secure the clip 160 to the extension member 150. Alternatively, the hooked end 188 may be secured to the mounting flange with an interference fit.

The secondary fuse link 152 is coupled to and extends between the clip and the contact pin 154 on opposite ends of the extension member 150. The secondary fuse link 152 is wrapped around the contact pin 154 on en end and electrically connected to the clip 160 at an opposite end. Between the clip 160 and the pin 154, the secondary fuse link 152 is extended along the inner surface 176 of the extension member 150, and the backing layer 158 maintains the secondary fuse link 152 in place and ensures that a portion of the secondary fuse link 152 extends over and adjacent the indicator material 156 in the cavity 178 of the extension member 150.

In further embodiments, an adhesive sealing compound may be employed in the fuse state indicator assembly 102, in particular over the extension member 150 on either side of the cavity 178. For example, a silicon caulk such as a Loctite 5088 compound familiar to those in the art may be used to inhibit possible fulgerite formation around the assembly 102, particularly in the vicinity of the window 124.

Figure 4:
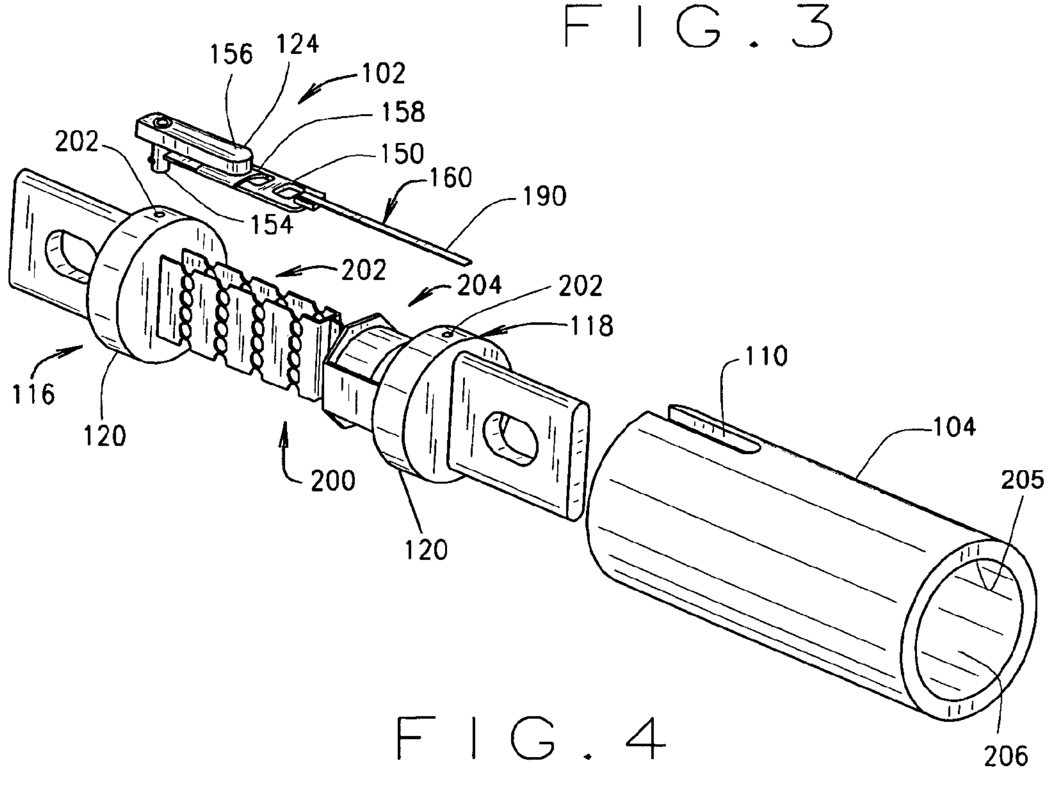
FIG. 4 is an exploded assembly view of the fuse shown in FIGS. 1 and 2.

FIG. 4 is an exploded assembly view of the fuse 100 including the fuse state indicator assembly 102. The clip 160 and the contact pin 154 extend from opposite ends of the extension member 150 and electrically connect the secondary fuse link 152 (FIG. 3) extending across the extension member 150.

A primary fuse element assembly 200 is electrically connected between the terminal elements 116 and 118 in a known manner. In an illustrative embodiment, the fuse element assembly 200 is a known "class J" fuse element having a short circuit portion 202 and a time delay portion 204, although it is appreciated that other known fuse elements, fusible links, fusible strips and the like may likewise be employed separately or in combination in further and/or alternative embodiments of the invention.

Each of the base portions 120 of the terminal elements 116 and 118 includes an aperture 202 therein, and one of the apertures 202 of the terminal elements 116 and 118 receives the contact pin 154 to mechanically and electrically connect the indicator assembly 102 to the respective terminal element. On the other hand, the strip 190 of the clip 160 extends to the opposite terminal element 116 or 118, and when the fuse 100 is assembled, the strip portion is trapped between the base portion 120 and an interior surface 204 of the body 104. The contact pin 154 anchors a first end of the assembly to the terminal element 116, and when the extension member 150 is fitted within the slot 110 in the fuse body 104, the clip 160 is aligned with the opposite terminal element 118 to make electrical contact therewith. When the primary fuse element 200 is received in a bore 206 through the fuse body 104, the primary fuse element assembly is enclosed within the bore 206, and when the terminal elements 116 and 118 are coupled to the body and the indicator assembly 102 is connected thereto via the contact pin 154 and the clip 160 as described above, the secondary fuse link 152 of the indicator assembly 102 is electrically connected in parallel with the primary fuse element assembly 200 between the terminal elements.

In an illustrative embodiment, apertures 202 are provided in each terminal element 116, and 118 and the apertures 202 are aligned with one another such that the indicator assembly may be installed with the contact pin extending into either of the terminal elements 116 and 118, with the clip 160 engaging the other of the terminal elements 116 and 118. Alternatively, an aperture 202 could be provided in only one of the terminal elements 116, 118 in an embodiment wherein the indicator assembly 102 can be installed in one position only. Additionally, in another embodiment, the extension member 150 could be lengthened and contact pins 154 could be employed at both ends to establish electrical connection of the secondary fuse link 152 to the terminal elements 116, 118.

Once installed, the fuse state indicator assembly 102 functions as follows. When the primary fuse element assembly 200 opens due to a fault current, the current flows, via the contact pin 154 and the clip 160, through the parallel secondary fuse link 152 of the indicator assembly 102, which causes the secondary fuse link 152 to melt or vaporize. The resultant heat ignites the indicator material 156, and the combustible substance is consumed by confined burning within the recessed cylindrical cavity 178 (FIG. 3) in the extension member 150. When the combustion is complete, the backing layer 158 is visible through the window 124.

Thus, an operative condition or state of the fuse 100 is readily indicated by a visible change of color from, for example, a light color to a dark color, as seen through the window 140. The color visible through the window 240 reflects the respective colors of the indicator material 156 in an unopened or operative condition and the backing layer 158 in an opened or inoperative state after the primary fuse element 200 has opened. That is, to an observer viewing the window 124, when the primary fuse element assembly 200 is operable (i.e., has not melted or opened) the light-colored combustible substance is visible through the window 124. However, when the primary fuse element assembly 200 is inoperable due to melting or opening from a fault current, the current vaporizes the secondary fuse link 152 ignites and consumes the indicator material 156, and thereby reveals the contrasting dark-colored backing layer 158 so that it is visible through the window 124.

Reliable fuse state indication is therefore provided at relatively low cost and in a straightforward fashion. By virtue of the contact pin 154 and the clip 160, the indicator assembly 102 may be reliably mechanically and electrically connected to, for example, end bell terminal elements without damaging the indicator assembly and at lower cost than other known indicator assemblies for such fuses. The indicator assembly 102 may be readily adapted for use in a large variety of shapes, configurations, types, and ratings of fuses.

While the invention has been described in terms of various specific embodiments, those skilled in the art will recognize that the invention can be practiced with modification within the spirit and scope of the claims.

What is claimed is:

1. An electric fuse comprising:

a nonconductive fuse body;

first and second terminal elements coupled to said fuse body;

a primary fuse element electrically connected between said first and second terminal elements, said primary fuse element extending within and enclosed by said fuse body; and a fuse state indicator assembly comprising a secondary fuse element electrically connected between said first and second terminal elements in parallel with said primary fuse element, a contact pin mechanically and electrically connecting said secondary fuse element to one of said terminal elements, and a combustible substance adjacent said secondary fuse element, wherein said fuse state indicator assembly further comprises an extension member having a conductive end which electrically connects said secondary fuse element to the other of said terminal elements, a portion of said extension member extending within a slot in said fuse body and exposed to an exterior of said fuse body, and a portion of said extension member extending interior to said fuse body.

2. An electric fuse in accordance with claim 1 further comprising an aperture formed in one of said terminal elements, said aperture receiving said contact pin.

3. An electric fuse in accordance with claim 1 wherein said secondary fuse element is wrapped around said contact pin.

4. An electric fuse in accordance with claim 1 wherein at least one of said terminal elements comprises an end bell, said end bell comprising an aperture formed therein, said aperture receiving said contact pin.

5. An electric fuse in accordance with claim 1 wherein said fuse state indicator assembly further comprises a conductive clip electrically connecting said secondary fuse element to the other of said terminal elements.

6. An electric fuse comprising:

a nonconductive fuse body:

first and second terminal elements coupled to said fuse body:

a primary fuse element electrically connected between said first and second terminal elements, said primary fuse element extending within and enclosed by said fuse body; and a fuse state indicator assembly comprising a secondary fuse element electrically connected between said first and second terminal elements in parallel with said primary fuse element, a contact pin mechanically and electrically connecting said secondary fuse element to one of said terminal elements, and a combustible substance adjacent said secondary fuse element, wherein said fuse body comprises a longitudinal slot therein, said indicator assembly further comprising a transparent lens located within said slot, the combustible substance positioned adjacent said transparent lens, wherein at least a portion of said combustible substance is visible through said transparent lens before said primary fuse element is opened.

7. An electric fuse comprising:

a tubular fuse body having a first end, a second end, and a longitudinal slot formed therein for fuse state identification, said longitudinal slot extending from the first end toward the second end;

first and second end bell assemblies coupled to said body, the first end bell assembly adjoining said longitudinal slot;

a primary fuse element electrically connected between said first and second end bell assemblies; and a fuse state indicator assembly comprising an extension member, a secondary fuse link coupled to said extension member, and at least one contact pin coupled to said secondary fuse link and establishing an electrical connection to one of said first and second end bell assemblies, wherein said indicator assembly is located in said longitudinal slot.

8. An electric fuse in accordance with claim 7 further comprising a combustible substance adjacent said secondary fuse link, said combustible substance visible for fuse state indication through said slot of said fuse body by the presence or absence of said combustible substance.

9. An electric fuse in accordance with claim 7 further comprising a conductive clip extending from an end of said extension member, said clip configured to engage the other of said first and second end bell assemblies.

10. An electric fuse in accordance with claim 7 wherein said secondary fuse link is wrapped around said contact pin.

11. A method for manufacturing a fuse with a fuse state indicator comprising:

providing a nonconductive fuse body;

providing first and second terminal elements coupled to said fuse body;

providing a primary fuse element electrically connected between said first and second terminal elements, said primary fuse element extending within and enclosed by said fuse body;

providing a fuse state indicator assembly comprising a secondary fuse link electrically connected between said first and second terminal elements in parallel with said primary fuse link, a contact pin mechanically and electrically connecting said secondary fuse link to one of said terminal elements, and a combustible substance adjacent to said secondary fuse link; and providing in the nonconductive fuse body a slot that adjoins the first terminal element and extends towards the second terminal element.

12. The method of claim 11, wherein the secondary fuse link is wrapped around the contact pin.

13. The method of claim 11, wherein the first terminal element comprises a first end bell and the second terminal element comprises a second end bell.

14. The method of claim 11, wherein the one of said terminal elements comprises an aperture and wherein the contact pin is disposed in the aperture.

15. The method of claim 11, wherein the fuse state indicator assembly further comprises an extension member supporting the secondary fuse link.

16. An fuse having a fuse state indicator comprising:

a nonconductive fuse body;

first and second terminal elements coupled to said fuse body;

a primary fuse element electrically connected between said first and second terminal elements, said primary fuse element extending within and enclosed by said fuse body;

a fuse state indicator assembly comprising a secondary fuse link electrically connected between said first and second terminal elements in parallel with said primary fuse element, a contact pin mechanically and electrically connecting said secondary fuse link to one of said terminal elements, and a combustible substance adjacent said secondary fuse link; and an aperture formed in one of said terminal elements, said aperture receiving said contact pin, wherein said secondary pin fuse link is wrapped around said contact pin, wherein said fuse state indicator assembly comprises an extension member, a portion of said extension member extending within a slot in said fuse body and exposed to an exterior of said fuse body.

17. The fuse of claim 16, wherein the extension member comprises electrically insulating material.

18. The fuse of claim 16, wherein the extension member supports the secondary fuse link.

19. The fuse of claim 16, wherein the first terminal element comprises a first end bell and wherein the second terminal element comprises a second end bell.

20. The fuse of claim 16, wherein the slot adjoins the first terminal element or the second terminal element.

21. The method of claim 20, wherein the extension member comprises electrically insulating material.

22. The fuse of claim 16, wherein the slot adjoins the one of said terminal elements.

* * * * *